(12) United States Patent
Chou et al.

(10) Patent No.: US 7,868,535 B2
(45) Date of Patent: Jan. 11, 2011

(54) LIGHT EMITTING DEVICE USING PHOSPHOR POWDER

(75) Inventors: Mitch M. C. Chou, Chiayi (TW); Wen-Ching Hsu, Hsinchu (TW); Cheng-Hung Wei, Kaohsiung (TW)

(73) Assignees: National Sun Yat-Sen University, Kaohsiung (TW); Sino American Silicon Products Inc., Hsinchu (TW)

( * ) Notice: Subject to any disclaimer, the term of this patent is extended or adjusted under 35 U.S.C. 154(b) by 704 days.

(21) Appl. No.: 11/808,770

(22) Filed: Jun. 12, 2007

(65) Prior Publication Data

US 2008/0231172 A1    Sep. 25, 2008

(30) Foreign Application Priority Data

Mar. 22, 2007 (TW) ................................ 096110016

(51) Int. Cl.
*H01J 1/62*     (2006.01)
*H01J 63/04*    (2006.01)
*C09K 11/02*    (2006.01)
*C09K 11/77*    (2006.01)

(52) U.S. Cl. ................................ 313/503; 252/301.4 R
(58) Field of Classification Search ................. 313/503; 252/301.4 R
See application file for complete search history.

*Primary Examiner*—C. Melissa Koslow
*Assistant Examiner*—Matthew E Hoban
(74) *Attorney, Agent, or Firm*—Jackson IPG PLLC; Demian K. Jackson

(57) ABSTRACT

The present invention is a light emitting device which uses a specific phosphor powder. The phosphor powder is a combination of cerium (Ce) and lithium aluminum oxide ($LiAlO_2$). They are mixed under a specific range of composition ratio. With the specific phosphor powder applied, the light emitting device has advantages in a low cost, a reduced power consumption, an easy production, a long life, and so on. In addition, a transformation efficiency of the phosphor powder is high and so a light emitting efficiency of the light emitting device is enhanced.

14 Claims, 4 Drawing Sheets

LIGHT EMITTING DEVICE USING PHOSPHOR POWDER

FIELD OF THE INVENTION

The present invention relates to a light emitting device; more particularly, relates to a phosphor powder combination having a rare earth element of cerium for effectively improving a light emitting efficiency.

DESCRIPTION OF THE RELATED ARTS

White light emitting diodes (LED) and high brightness LEDs are two major fields in developing LEDs. Due to environmental concerns and an upward trend in power costs, a white-light LED has become an urgent need in the fields of displaying and lightening for its power saving and light weight.

Materials used in producing white-light LEDs are divided into organic LEDs and non-organic LEDs. Two major white-light LEDs in the market are as follows:

(a) One is a mainstream LED, which has a blue LED exciting a phosphor powder of yttrium aluminum garnet (YAG). As shown in FIG. 3, a blue LED chip 21 emits a wavelength between 400 nanometers (nm) and 530 nm; and an optical adhesive 22 mixed with a phosphor powder of YAG covers around the blue LED chip 21. The light emitted from the blue LED chip 21 excites the YAG phosphor powder for obtaining a yellow light having a 555 nm wavelength, where the yellow light is mixed in a lens with some extra complementary blue light emitted from the blue LED chip 21 to obtain a white light.

However, the prior art obtaining the white light by mixing the blue light emitted from the blue LED and the yellow light emitted from the YAG phosphor powder has the following disadvantages:

(1) Because the blue light plays a major role in the whole process, color temperature is high and uneven.
(2) Because the wavelength of the blue light emitted is changing with the temperature, the color of the white light obtained is not easily controlled.
(3) And, color rendition is poor for red light and is weak.

(b) Another prior art is a white-light LED having red-blue-green phosphor powders with a high light emitting efficiency and a high color rendition. Yet, the materials for different color phosphor powders have different voltages, so that controlling design becomes complex and light mixing becomes difficult. As shown in FIG. 4, an ultraviolet (UV) LED grain 31 excites an optical adhesive 32 evenly mixed with a certain ratio of red-blue-green phosphor powders to obtain a white light of three mixed wavelengths. The white light of three mixed wavelengths has a high rendition, but has a bad light emitting efficiency. In addition, because the UV LED grain 31 is used as a light source and may do harm to the human body, the UV LED grain 31 is blocked inside the whole white light LED.

The prior art has disadvantages including insufficient brightness and uneven luminescence, and, as a result, light transformation efficiencies need to be enhanced, luminescence evenness needs to be improved and the UV leakage needs to be prevented, if used. Hence, the prior art does not fulfill all users' needs in actual use.

SUMMARY OF THE INVENTION

The main purpose of the present invention is to obtain a light emitting device with a low cost, a reduced power consumption, an easy production method, a uniformed light color, a non-bias color and a long lifetime, while, after adding a rare earth element to a phosphor powder combination, a light transformation efficiency of the phosphor powder combination is enhanced for improving light emitting efficiency.

To achieve the above purpose, the present invention is a light emitting device using a phosphor powder, comprising a light emitting element and a phosphor powder layer, where, through mixing colors of micro-lights emitted from crystal grains of a phosphor powder combination in the phosphor powder layer, a light spectrum emitted from the light emitting element is transformed into a requested light spectrum. Accordingly, a novel light emitting device using a phosphor powder is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is the structural view showing the first preferred embodiment according to the present invention;

DESCRIPTIONS OF THE PREFERRED EMBODIMENTS

The following descriptions of the preferred embodiments are provided to understand the features and the structures of the present invention.

Figure 1:
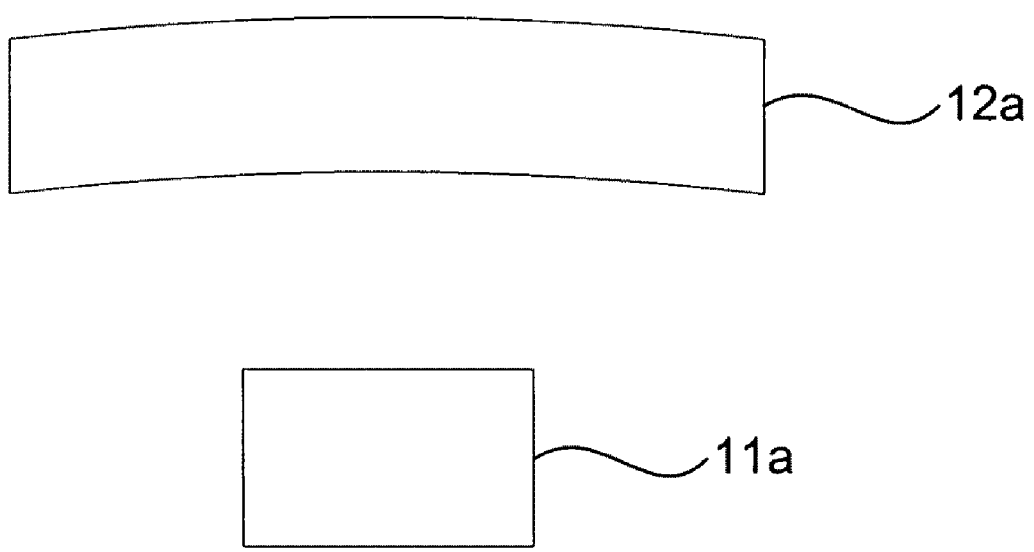

Please refer to FIG. 1, which is a structural view showing a first preferred embodiment according to the present invention. As shown in the figure, the present invention is a light emitting device using a phosphor powder, comprising a light emitting element 11a and a phosphor powder layer 12a, where the device provides a low cost, a reduced power consumption, an easy production method, a uniformed and non-biased light color and a long lifetime; and, after adding a rare earth element, a light transformation efficiency of a phosphor powder combination is enhanced for improving a light emitting efficiency.

The light emitting element 11a emits a light spectrum, where the light emitting element 11a is a light emitting diode (LED), an electronic gun, an organic light emitting diode (OLED) or a general light source.

The phosphor powder layer 12a is formed on the light emitting element 11a to adjust a light color of the light emitting element 11a, where the phosphor powder layer 12a has a flat surface, an arc surface or any geometric surface.

On using the present invention, the phosphor powder layer 12a is formed on the light emitting element 11a through a wet coating or a dry deposition. The phosphor powder layer 12a has a phosphor powder combination obtained by a mixture under a dose composition ratio, where a wavelength emitted from the light emitting element 11a is changed by mixing colors of micro-lights emitted from crystal grains of the phosphor powder combination. The phosphor powder combination is Ce (cerium): $LiAlO_2$ (lithium aluminum oxide) emitting lights of three primary colors of red, blue and green, which has a dose composition ratio of 0.0001 percent (%) to 5% and is mixed in a transparent medium to form the phosphor powder layer 12a. The phosphor powder layer 12a emits the desired light spectrum, such as an ultra violet light, a blue light, a white light or other light source, through mixing colors of micro-lights emitted from crystal grains of the phosphor powder combination with a light spectrum provided by the light emitting element 11a, where the transparent medium is made of silicon oxide, titanium oxide or an epoxy resin.

During the wet coating, the phosphor powder, which is Ce:LiAlO$_2$ and has a dose composition ratio of 0.0001% to 5%, and the transparent medium are directly weighted to be added in a proper solvent for an even mixture; or, the phosphor powder and the transparent medium are mixed under an atomic state in a solution through a sol-gel method or a co-precipitation method to be added in the solvent. Then the mixture is coated on the light emitting element 11a through spin-coating or print-coating for obtaining a light spectrum excited by a light.

During the dry deposition, the phosphor powder, which is Ce:LiAlO$_2$ and has a dose composition ratio of 0.0001% to 5%, and the transparent medium are directly weighted to obtain a target; or, the phosphor powder and the transparent medium are mixed under an atomic state in a solution through a sol-gel method or a co-precipitation method to obtain a target. Then the target is deposited on the light emitting element 11a through evaporation, sputtering or ion-beam deposition for obtaining a light spectrum excited by a light.

Therein, the rare earth element of Ce in the Ce:LiAlO$_2$ phosphor powder combination is further any rare earth element, such as lanthanum (La), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) or yttrium (Y); and, the LiAlO$_2$ in the Ce:LiAlO$_2$ phosphor powder combination is further lithium gallium oxide (LiGaO$_2$), lithium silicon oxide (Li$_2$SiO$_3$), lithium germanium oxide (LiGeO$_3$), sodium aluminum oxide (NaAlO$_2$), sodium germanium oxide (Na$_2$GeO$_3$), sodium silicon oxide (Na$_2$SiO$_3$), lithium phosphor oxide (Li$_3$PO$_4$), lithium arsenic oxide (Li$_3$AsO$_4$), lithium vanadium oxide (Li$_3$VO$_4$), lithium magnesium germanium oxide (Li$_2$MgGeO$_4$), lithium zinc germanium oxide (Li$_2$ZnGeO$_4$), lithium cadmium germanium oxide (Li$_2$CdGeO$_4$), lithium magnesium silicon oxide (Li$_2$MgSiO$_4$), lithium zinc silicon oxide (Li$_2$ZnSiO$_4$), lithium cadmium silicon oxide (Li$_2$CdSiO$_4$), sodium magnesium germanium oxide (Na$_2$MgGeO$_4$), sodium zinc germanium oxide (Na$_2$ZnGeO$_4$) or sodium zinc silicon oxide (Na$_2$ZnSiO$_4$). Thus, a novel light emitting device using a phosphor powder is obtained.

Figure 2:
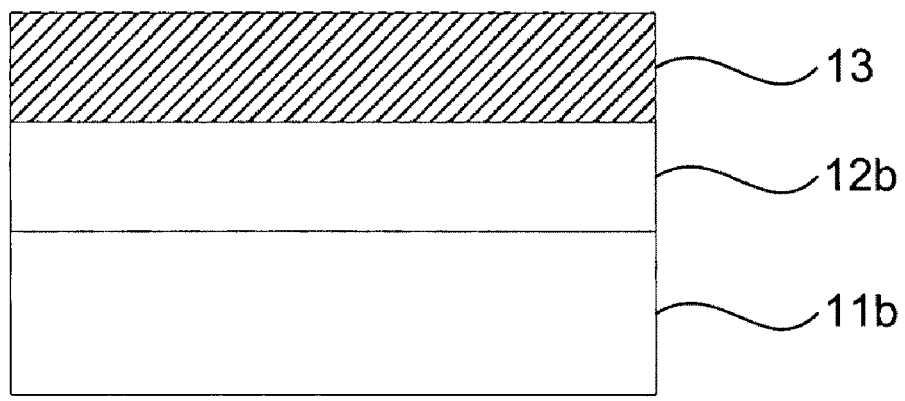
FIG. 2 is the structural view showing the second preferred embodiment.
Figure 3:
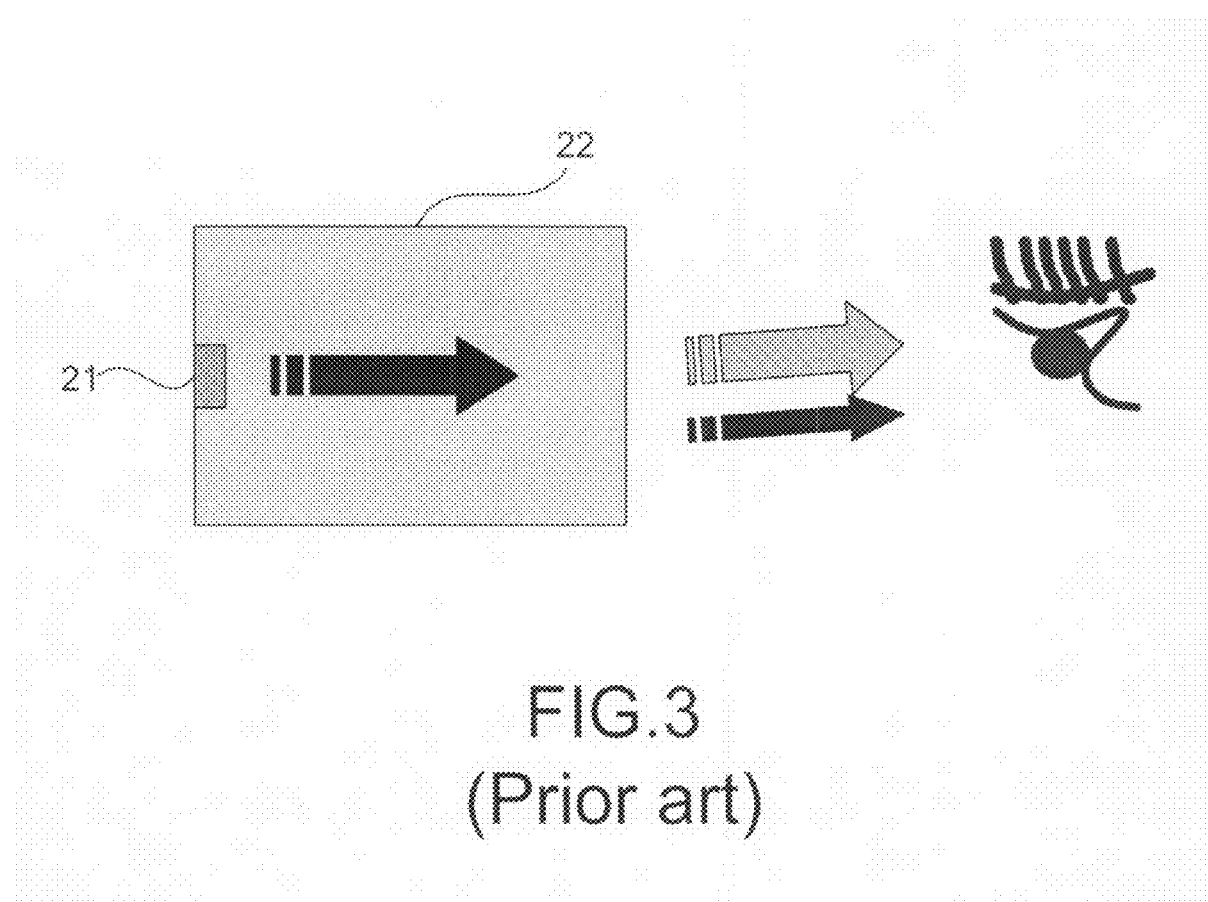
FIG. 3 is the view of the general white-light LED.
Figure 4:
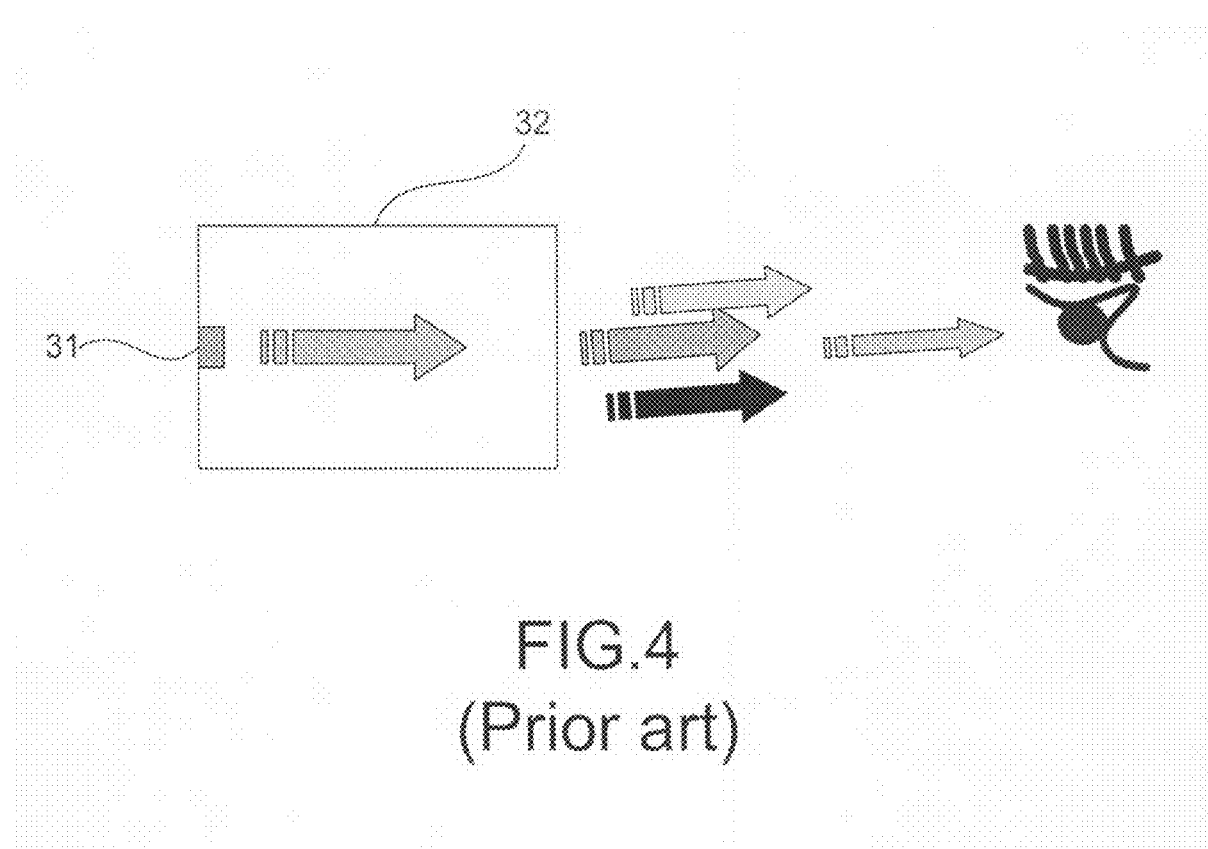
FIG. 4 is the view of the white-light LED excited by the UV light.

Please refer to FIG. 2, which is a structural view showing a second preferred embodiment. As shown in the figure, the present invention is a light emitting device using a phosphor powder, comprising a light emitting element 11b and a phosphor powder layer 12b, where the device provides a low cost, a reduced power consumption, an easy production method, a uniformed and non-biased light color and a long lifetime; and, after adding a rare earth element, a light transformation efficiency of a phosphor powder combination is enhanced for improving a light emitting efficiency.

The light emitting element 11b emits a light spectrum, where the light emitting element 11b is a LED, an electronic gun, an OLED or a general light source.

The phosphor powder layer 12b is formed on the light emitting element 11b to adjust a light color of the light emitting element 11b, where the phosphor powder layer 12b has a packaging layer 13 made of an acrylate resin, a fluoro resin, an epoxy resin, a Si$_3$N$_4$ film or a DLC film; and the phosphor powder layer 12b has a flat surface, an arc surface or any geometric surface.

On using the present invention, the phosphor powder layer 12b is formed on the light emitting element 11b through a wet coating or a dry deposition. The phosphor powder layer 12b has a phosphor powder combination obtained by a mixture under a dose composition ratio, where a wavelength emitted from the light emitting element 11b is changed by mixing colors of micro-lights emitted from crystal grains of the phosphor powder combination. The phosphor powder layer 12b has a phosphor powder combination of Ce:LiAlO$_2$ emitting lights of three primary colors of red, blue and green, which has a dose composition ratio of 0.0001% to 5% and is mixed in a transparent medium to for the phosphor powder layer 12b. The phosphor powder layer 12b emits the desired light spectrum, such as an ultra violet light, a blue light, a white light or other light source, through mixing colors of micro-lights emitted from crystal grains of the phosphor powder combination with a light spectrum provided by the light emitting element 11b, where the transparent medium is made of silicon oxide, titanium oxide or an epoxy resin.

During the wet coating, the phosphor powder, which is Ce:LiAlO$_2$ and has a dose composition ratio of 0.0001% to 5%, and the transparent medium are directly weighted to be added in a proper solvent; or, the phosphor powder and the transparent medium are mixed under an atomic state in a solution through a sol-gel method or a co-precipitation method to be added in the solvent. Then the mixture is coated on the light emitting element 11b through spin-coating or print-coating, and the coated mixture is hot-dried to remove the solvent and water. Then a packaging layer 13 is coated or deposited on the coated mixture, where the packaging layer 13 is made of an acrylate resin, a fluoro resin, an epoxy resin, a Si$_3$N$_4$ film or a DLC film.

During the dry deposition, the phosphor powder, which is Ce:LiAlO$_2$ and has a dose composition ratio of 0.0001% to 5%, and the transparent medium are directly weighted to obtain a target; or, the phosphor powder and the transparent medium are mixed under an atomic state in a solution through a sol-gel method or a co-precipitation method to obtain a target. Then the target is deposited on the light emitting element 11b through evaporation, sputtering or ion-beam deposition to form the phosphor powder layer 12b for obtaining a light spectrum excited by a light. And then a packaging layer 13 is formed as protection on the phosphor powder layer 12b through depositing a Si$_3$N$_4$ film or a DLC film or coating an acrylate resin, an epoxy resin or a fluoro resin.

Therein, the rare earth element of Ce in the Ce:LiAlO$_2$ phosphor powder combination is further any rare earth element, such as La, Pr, Nd, Pm, Sm, Eu, Gd, Tb, Dy, Ho, Er, Tm, Yb, Lu, Sc or Y; and, the LiAlO$_2$ in the Ce:LiAlO$_2$ phosphor powder combination is further LiGaO$_2$, Li$_2$SiO$_3$, LiGeO$_3$, NaAlO$_2$, Na$_2$GeO$_3$, Na$_2$SiO$_3$, Li$_3$PO$_4$, Li$_3$AsO$_4$, Li$_3$VO$_4$, Li$_2$MgGeO$_4$, Li$_2$ZnGeO$_4$, Li$_2$CdGeO$_4$, Li$_2$MgSiO$_4$, Li$_2$ZnSiO$_4$, Li$_2$CdSiO$_4$, Na$_2$MgGeO$_4$, Na$_2$ZnGeO$_4$ or Na$_2$ZnSiO$_4$. Thus, a novel light emitting device using a phosphor powder is obtained.

To sum up, the present invention is a light emitting device using a phosphor powder, where the present invention provides a low cost, a reduced power consumption, an easy production method, a uniformed and non-biased light color and a long lifetime; and, after adding a rare earth element, a light transformation efficiency of a phosphor powder combination is enhanced for improving a light emitting efficiency.

The preferred embodiments herein disclosed are not intended to unnecessarily limit the scope of the invention.

Therefore, simple modifications or variations belonging to the equivalent of the scope of the claims and the instructions disclosed herein for a patent are all within the scope of the present invention.

What is claimed is:

1. A light emitting device using a phosphor powder, comprising:
    a light emitting element; and
    a phosphor powder layer, said phosphor powder layer comprising a phosphor powder of $LiAlO_2$(lithium aluminum oxide):Ce(cerium), said phosphor powder layer being disposed on said light emitting element to change a light color of said light emitting element.

2. The device according to claim 1, wherein said light emitting element is a light source selected from a group consisting of a light emitting diode (LED) and an organic light emitting diode (OLED).

3. The device according to claim 1, wherein said phosphor powder layer emits light of the primary colors of red, blue and green.

4. The device according to claim 3, wherein said phosphor powder combination has a dose composition dopant ratio of $LiAlO_2$ to Ce of from 1,000,000:1 to 20:1.

5. The device according to claim 1, wherein-said phosphor powder of $LiAlO_2$:Ce optionally further comprising a second rare earth element selected from a group consisting of lanthanum (La), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), scandium (Sc) and yttrium (Y).

6. The device according to claim 1, wherein said phosphor powder layer changes a wavelength of said light emitting element through mixing colors of light emitted from said phosphor powder.

7. The device according to claim 1, wherein said phosphor powder layer has a transparent medium mixed with said phosphor powder.

8. The device according to claim 7, wherein said transparent medium is made of a material selected from a group consisting of silicon oxide, titanium oxide and an epoxy resin.

9. The device according to claim 1, wherein said phosphor powder layer is coated on said light emitting element through a wet coating.

10. The device according to claim 1, wherein said phosphor powder layer is coated on said light emitting element through a dry deposition.

11. The device according to claim 1, wherein said device emits a light selected from a group consisting of an ultraviolet light, a blue light and a white light.

12. The device according to claim 1, wherein said phosphor powder layer has a geometric surface selected from a group consisting of a flat surface and an arc surface.

13. The device according to claim 1, wherein said phosphor powder layer further comprises a packaging layer.

14. The device according to claim 13, wherein said packaging layer is made of a material selected from a group consisting of an acrylate resin, a fluoro resin, an epoxy resin, a silicon nitride ($Si_3N_4$) film and a diamond-like carbon (DLC) film.

* * * * *